United States Patent [19]

Hosoi et al.

[11] Patent Number: 4,626,479
[45] Date of Patent: Dec. 2, 1986

[54] COVERING METAL STRUCTURE FOR METALLIZED METAL LAYER IN ELECTRONIC PART

[75] Inventors: Yoshihiro Hosoi; Takaaki Fujioka, both of Kokubu, Japan

[73] Assignee: Kyocera Corporation, Kyoto, Japan

[21] Appl. No.: 790,332

[22] Filed: Oct. 23, 1985

[30] Foreign Application Priority Data

Oct. 26, 1984 [JP] Japan .................................. 59-226228

[51] Int. Cl.⁴ ........................................... B32B 15/04
[52] U.S. Cl. ................................. 428/663; 428/665; 428/672; 428/680; 428/936; 357/71
[58] Field of Search ............... 428/672, 680, 678, 663, 428/664, 665, 620, 621, 630, 632, 936, 929, 601; 357/71 R; 200/269; 174/52 FP, 68.5

[56] References Cited

U.S. PATENT DOCUMENTS

| | | | |
|---|---|---|---|
| 3,362,851 | 1/1968 | Dunster | 428/672 |
| 3,539,390 | 11/1970 | Widmann et al. | 357/71 |
| 3,663,184 | 5/1972 | Wood et al. | 428/672 |
| 3,761,309 | 9/1973 | Schmitter et al. | 428/672 |
| 3,977,840 | 8/1976 | Estep et al. | 428/632 |
| 4,503,131 | 3/1985 | Baudrand | 200/269 |

OTHER PUBLICATIONS

"Nickel/Gold Diffusion Barrier", J. R. Lynch, IBM Technical Disclosure Bulletin, vol. 14, No. 4, 9/71, p. 1099.

*Primary Examiner*—L. Dewayne Rutledge
*Assistant Examiner*—John J. Zimmerman
*Attorney, Agent, or Firm*—Spensley Horn Jubas & Lubitz

[57] ABSTRACT

A surface metal layer composed mainly of gold is formed on the surface of a metallized metal layer on an insulating substrate through a first intermediate metal layer composed of a nickel/boron alloy and a second intermediate metal layer composed of a nickel/phosphorus alloy. In this surface layer, appearance of stains or occurrence of blistering is prevented, and this surface metal layer is excellent in appearance characteristics, electric characteristics and durability.

6 Claims, 2 Drawing Figures

COVERING METAL STRUCTURE FOR METALLIZED METAL LAYER IN ELECTRONIC PART

BACKGROUND OF THE INVENTION (1) Field of the Invention

The present invention relates to a covering metal structure for a metallized metal layer in an electronic part. More particularly, the invention relates to a covering structure for a metallized metal layer in an electronic part such as a semiconductor package or a multi-layer circuit board. According to the present invention, appearance of strains or blisters on this covering metal layer is prevented, and the appearance characteristics, electric characteristics and durability of the electronic part can be improved.

(2) Description of the Prior Art

A metallized metal layer in an electronic part, which has to be prepared by non-electrode plating, such as a die attach metal layer for attachment of a semiconductor element of a plug-in type semiconductor package, a sealing metal layer for soldering of a lid member or a wire-bonding portion for attachment of a wire for connecting a semiconductor element to a lead line, has a covering structure as shown in FIG. 2. More specifically, according to the conventional technique, a metallized metal layer 2 formed on the surface of an insulating substrate 1 composed of an electrically insulating material such as ceramic or glass is covered with an intermediate metal layer 3 composed of a nickel/phosphorus alloy or a nickel/boron alloy for maintaining a sufficient bonding strength to a solder, and the surface of the intermediate layer 3 is covered with a surface metal layer 4 composed of gold for preventing degradation of the wettability of the intermediate metal layer 3 with the solder by oxidation of the intermediate metal layer 3 and also for tightly bonding a bonding wire.

Incidentally, the metallized metal layer 2 is formed from a powder of a high-melting-point metal such as tungsten (W), molybdenum (Mo) or molybdenum/manganese (Mo/Mn).

In this covering structure for a metallized metal layer of an electronic part, if a nickel/phosphorus alloy is formed as the intermediate metal layer 3 on the metallized metal layer 2 by non-electrode plating, since the surface of the metallized metal layer 2 is coarse and the phosphorus component in the nickel/phosphorus alloy is inactive, it is impossible to deposit the intermediate metal layer 3 in a uniform thickness on the entire surface of the metallized metal layer 2, and many pinholes (small holes) or voids (small gaps) are formed in the intermediate metal layer 3. If the plating solution is left in these pinholes or voids, the plating solution is caused to flow onto the surface metal layer 4 by heat applied at the step of attaching a semiconductor or lid member, with the result that spot stains are formed to degrade the surface characteristics of the electronic part. Furthermore, corrosion of the metal is advanced from these stains to degrade the electric characteristics of the part or shorten the life of the part. This is one of fatal defects of the conventional techniques.

If a nickel/boron alloy is deposited as the intermediate metal layer 3 by plating, since the adhesion of the boron component in the nickel/boron alloy to gold is poor and the thermal expansion coefficient of the nickel/boron alloy is greatly different from that of gold, the surface metal layer 4 is peeled from the intermediate metal layer 3 when heat is applied to the intermediate metal layer 3 and the surface metal layer 4 at the step of attaching a semiconductor element or a lid member, with the result that blistering is caused and it is impossible to tightly attach a semiconductor element or a bonding wire to the metallized metal layer 2. Furthermore, the mechanical strength is reduced in the blistered portion. This is another fatal defect of the conventional technique.

Accordingly, in the conventional covering structure for a metallized metal layer, which comprises a nickel/phosphorus alloy or a nickel/boron alloy as the intermediate layer, the manufacturing yield is extremely low, and increase of the manufacturing yield is eagerly desired.

SUMMARY OF THE INVENTION

Under this background, we made research, and as the result, we found that if the surface of a metallized metal layer is covered with an intermediate metal layer comprising at least a first intermediate metal layer composed mainly of a nickel/boron alloy, which is located on the side of the metallized metal layer, and a second intermediate metal layer composed mainly of a nickel/phosphorus alloy, which is formed on the first intermediate metal layer, and the surface of this intermediate metal layer is covered with a surface metal layer composed mainly of gold, even if heat is applied at the step of attaching a semiconductor element or a lid member, formation of spot-like stains degrading the appearance characteristics and occurence of blistering by peeling of the surface metal layer from the intermediate metal layer can be effectively prevented. We have now completed the present invention based on this finding.

It is therefore a primary object of the present invention to provide a covering structure for a metallized metal layer of an electronic part, in which formation of spot-like stains degrading the appearance characteristics or occurrence of blistering by peeling of the surface metal layer from the intermediate metal layer can be completely prevented and which can impart excellent appearance characteristics, electric characteristics and durability to the electronic part.

In accordance with the present invention, there is provided a covering structure for a metallized metal layer of an electronic part, wherein the surface of a metallized layer on an insulating substrate is covered with an intermediate metal layer comprising at least a first intermediate metal layer composed mainly of a nickel/boron alloy, which is located on the side of the metallized metal layer, and a second intermediate metal layer composed mainly of a nickel/phosphorus alloy, which is located on the first intermediate metal layer, and the surface of the intermediate metal layer is covered with a surface metal layer composed mainly of gold.

Figure 1:
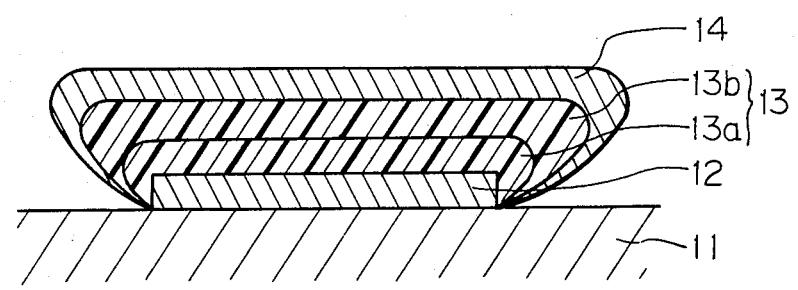
FIG. 1 is a sectional view illustrating the covering structure for a metallized metal layer of an electronic part according to the present invention.
Figure 2:
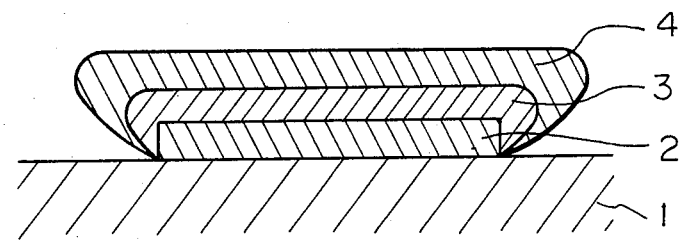
FIG. 2 is a sectional view illustrating the conventional covering structure for a metallized metal of an electronic part.

In the drawings, each of reference numerals 1 and 11 represents an insulating substrate, each of reference numerals 2 and 12 represents a metallized metal layer, each of reference numerals 3 and 13 represents an intermediate metal layer, each of reference numerals 4 and 14 represents a surface metal layer, reference numeral 13a represents a first intermediate metal layer, and reference numeral 13b represents a second intermediate metal layer.

DETAILED DESCRIPTION OF THE PREFERRED EMBODIMENTS

The present inventin will now be described in detail with reference to FIG. 1 of the accompanying drawings.

FIG. 1 is a sectional view illustrating the covering structure for a metallized metal layer of an electronic part according to the present invention. In FIG. 1, reference numeral 11 represents an insulating substrate composed of an electrically insulating material such as ceramic or glass, and reference numeral 12 represents a metallized metal layer.

The metallized metal layer 12 is formed by applying a paste comprising a powder of a high-melting-point metal such as tungsten (W), molybdenum (Mo) or molybdenum/manganese (Mo/Mn) and an appropriate organic binder on the top face of the insulating substrate 11 according to the known screen printing method and sintering the paste.

The metallized metal layer 12 is covered with the intermediate metal layer 13 comprising the first intermediate metal layer 13a composed mainly of a nickel/boron alloy and the second intermediate metal layer 13b composed mainly of a nickel/phosphorus alloy, and the surface of the intermediate metal layer 13 is covered with the surface metal layer 14 composed mainly of gold.

As the reducing agent for non-electrode plating of nickel on the metallized metal layer, a hypophosphorous acid salt is most widely used, and hydrazine or a boron hydride compound is sometimes used. The formed plating layer is composed of an alloy comprising nickel and the element in the reducing agent.

In the present invention, at the step of non-electrode plating of Ni on the metallized metal layer 12, non-electrode plating of Ni is first carried out by using a boron hydride compound as the reducing agent to form a first intermediate metal layer 13a composed of a Ni/B alloy, and non-electrode plating of Ni is then carried out by using a hypophosphorous acid salt as the reducing agent to form a second intermediate metal layer 13b composed of a Ni/P alloy.

The composition of the Ni/B alloy constituting the first intermediate metal layer 13a differs according to the composition of the plating solution. Generally, the Ni/B alloy comprises 0.1 to 8% by weight, especially 0.1 to 3% by weight, of boron and 92 to 99.9% by weight, especially 97 to 99.9% by weight, of nickel. Furthermore, the Ni/P alloy constituting the intermediate metal layer 13b comprises 1 to 20% by weight, especially 5 to 15% by weight, of phosphorous and 80 to 99% by weight, especially 85 to 95% by weight, of nickel.

The first intermediate metal layer 13a is formed according to the non-electrode plating method using a non-electrode plating solution comprising a nickel compound such as nickel sulfate and a boron type reducing agent such as sodium boron hydride, N-dimethylborazane, N-diethylborazane or N-trimethylborazane. If a nickel/boron alloy is thus formed on the metallized metal layer 12 by using a boron type reducing agent having a strong catalytic activity, such as sodium boron hydride or N-dimethylborazane, the first intermediate layer 13a having no pinholes or no voids in the interior thereof can be formed in a uniform thickness on the coarse surface of the metallized metal layer 12.

Typical instances of the Ni/B-type non-electrode plating solution are shown in Table 1.

TABLE 1

|  | Solution No. | | |
| --- | --- | --- | --- |
|  | 1 | 2 | 3 |
| Nickel sulfate (g/l) | 30 | 30 | 30 |
| Sodium citrate (g/l) | — | 10 | — |
| Sodium malonate (g/l) | 34 | — | — |
| Sodium succinate (g/l) | — | 20 | — |
| Sodium acetate (g/l) | — | 20 | — |
| Malic Acid | — | — | 27 |
| Glycine | — | — | 18 |
| N—Dimethylborazane (g/l) | 3.5 | 3.5 | 3.5 |
| Stabilizer (Pb, thiourea, ppm) | — | 10 | — |
| pH Value | 5.1–6.0 | 6–7 | 6.9–7.6 |
| Temperature (°C.) | 65–75 | 60–70 | 50–65 |
| Plating speed (μm/hr) | 5–15 | 5–15 | 5–15 |

The second intermediate metal layer 13b is formed according to the non-electrode plating method using a non-electrode nickel plating solution containing a nickel compound and a phosphorus type reducing agent such as sodium hypophosphite.

Typical instances of the composition of the Ni/P type non-electrode plating solution are shown in Table 2.

TABLE 2

|  | Solution No. | | |
| --- | --- | --- | --- |
|  | 1 | 2 | 3 |
| Nickel sulfate (g/l) | 35 | 26 | 21 |
| Sodium acetate (g/l) | 7 | 27 | — |
| Sodium citrate (g/l) | 10 | 15 | — |
| Propionic acid (g/l) | — | — | 2.2 |
| Lactic acid (g/l) | — | — | 27 |
| Sodium hypophosphite (g/l) | 10 | 16 | 24 |
| Stabilizer (thiourea, ppm) | — | 3–5 | — |
| pH Value | 5.4–5.8 | 5.0–5.5 | 4.5–5.5 |
| Temperature (°C.) | 80–95 | 80–95 | 80–95 |
| Plating speed (μm/hr) | 10–30 | 10–30 | 10–30 |

In the present invention, this second intermediate metal layer 13b exerts the function of strongly bonding the surface metal layer 14 of gold, formed on the surface of the second intermediate metal layer 13b, to the first intermediate metal layer 13a. The theoretical ground of this function of the second intermediate metal layer 13b has not been completely elucidated. However, it is considered that the reason why a strong plating layer free of voids or blisters is formed in the present invention is that since the first intermediate metal layer 13a composed mainly of a nickel/boron alloy is formed by the plating operation using a boron type reducing agent having a strong catalytic activity and the surface of this layer 13a is very smooth, the second intermediate metal layer 13b is deposited in a uniform thickness on the surface of the first intermediate metal layer 13a without formation of pinholes or voids, and since the substitution reaction of the nickel/phosphorus alloy with gold is slow, when the surface metal layer 14 of gold is formed on the nickel/phosphorus alloy layer 13b, the crystal of gold is densified to increase the bonding strength. Another reason is considered to be that the thermal expansion coefficient of the nickel/phosphorus alloy is close to that of gold.

The surface metal layer 14 composed mainly of good is deposited on the surface of the second intermediate metal layer 13b, and this surface metal layer 14 exerts the function of preventing oxidation of the intermediate metal layer 13 (layers 13a and 13b).

This surface metal layer 14 composed mainly of gold is formed on the surface of the intermediate metal layer 13 according to the known non-electrode plating method.

covering structure formed by depositing only the nickel/boron alloy on the metallized metal layer.

Each sample was heat-treated in air at 450° C. for 2 minutes, and the surface metal layer was examined by a microscope, and the number of test pieces where spot-like stains appeared and the number of test pieces where blistering was caused in the surface metal layer were counted.

The obtained results are shown in Table 3.

TABLE 3

| Sample No. | Thickness ($\mu$m) of First Intermediate Metal Layer of Ni/B Alloy | Thickness ($\mu$m) of Second Intermediate Metal Layer of Ni/P Alloy | Number of Test Pieces in Which Spot-like Stains Appeared | Number of Test Pieces in Which Blistering Was Caused in Surface Metal Layer |
|---|---|---|---|---|
| 1 | 0.3 | 1.0 | 6 | 0 |
| 2 | 1.0 | 1.0 | 0 | 0 |
| 3 | 3.0 | 1.0 | 0 | 0 |
| 4 | 1.0 | 0.3 | 0 | 5 |
| 5 | 1.0 | 3.0 | 0 | 0 |
| 6 | Ni/P (3.0 $\mu$m) | | 52 | 0 |
| 7 | Ni/B (3.0 $\mu$m) | | 0 | 58 |

Incidentally, at least one metal layer having a smooth surface, for example, a metal layer composed mainly of nickel or a nickel alloy, may be interposed between the first intermediate metal layer 13a and the second intermediate metal layer 13b.

In the present invention, it is preferred that the thickness of the first intermediate metal layer 13a of the Ni/B alloy be 0.5 to 3 $\mu$m, especially 1 to 2 $\mu$m, and it also is preferred that the thickness of the second intermediate metal layer 13b of the Ni/P alloy be 0.5 to 3 $\mu$m, especially 1 to 2 $\mu$m. Furthermore, it is preferred that the total plating layer thickness be 0.5 to 5 $\mu$m, especially 1 to 3 $\mu$m.

The present invention will now be described in detail with reference to the following example that by no means limits the scope of the invention.

EXAMPLE

With respect to each sample, 100 test pieces having a metallized metal layer having a size of 2 cm×5 cm and being composed of tungsten, which was formed on an insulating substrate of alumina ceramic, were prepared. A nickel/boron alloy was deposited in a thickness shown in Table 3 as the first intermediate as the first intermediate metal layer on the surface of the metallized metal layer by using a non-electrode plating solution containing a nickel compound and N-dimethylborazane as the reducing agent (marketed under the tradename of "BEL 801"). Then, a nickel/phosphorus alloy was deposited in a thickness shown in Table 3 as the second intermediate metal layer on the surface of the first intermediate metal layer by using a non-electrode nickel plating solution containing a nickel compound and sodium hypophosphite (marketed under the tradename of "S-780"). Then, a surface metal layer composed of gold was formed in a thickness of 1.5 $\mu$m on the surface of the second intermediate metal layer by using a non-electrode gold plating solution (marketed under the tradename of "Gold Eight").

Samples 6 and 7 were comparative samples to be compared with the products of the present invention. Namely, sample 6 had a conventional covering structure formed by depositing only the nickel/phosphorus alloy on the metallized metal layer, and sample 7 had a As is apparent from the foregoing experimental results, in the conventional covering structure for a metallized metal layer, which comprises an intermediate layer of a nickel/phosphorus alloy or nickel/boron alloy formed according to the non-electrode plating method, among 100 test pieces, 52 or 58 test pieces are defective because of degradation of the appearance characteristics by formation of spot-like stains or occurrence of blistering in the surface metal layer. In contrast, in the covering structure for a metallized metal layer according to the present invention, formation of such defective test pieces is substantially completely prevented.

Accordingly, the covering structure for a metallized metal layer according to the present invention is very valuable for an electronic part having a plated metal layer formed by the non-electrode plating method, for example, as a die attach metal layer for attachment of a semiconductor element of a plug-in type semiconductor package or as a sealing metal layer for soldering of a lid member.

Incidentally, the present invention is not limited to the foregoing embodiments, but various modification can be made without departing from the scope of the invention.

We claim:

1. A covering structure for a metallized metal layer of an electronic part, wherein the surface of a metallized layer on an insulating substrate is covered with an intermediate metal layer comprising at least a first intermediate metal layer composed mainly of a nickel/boron alloy, which is located on the side of the metallized metal layer, and a second intermediate metal layer composed mainly of a nickel/phosphorus alloy, which is located on the first intermediate metal layer, and the surface of the intermediate metal layer is covered with a surface metal layer composed mainly of gold.

2. A covering structure as set forth in claim 1, wherein the first intermediate metal layer is composed of an alloy comprising 0.1 to 8% by weight of boron and 92 to 99.9% by weight of nickel.

3. A covering structure as set forth in claim 1, wherein the second intermediate metal layer is composed of an alloy comprising 1 to 20% by weight of phosphorus and 80 to 99% by weight of nickel.

4. A covering structure as set forth in claim 1, wherein the metallized metal layer is composed of tungsten, molybdenum or molybdenum/manganese.

5. A covering structure as set forth in claim 1, wherein the thickness of the first intermediate layer is 0.5 to 3 μm and the thickness of the second intermediate metal layer is 0.5 to 3 μm.

6. A covering structure as set forth in claim 1, wherein the first intermediate metal layer is formed by the non-electrode plating using a plating solution containing a nickel compound and a boron type reducing agent, and the second intermediate metal layer is formed by the non-electrode plating using a plating solution containing a nickel compound and a phosphorus type reducing agent.

* * * * *